(12) United States Patent
Arensmeier

(10) Patent No.: US 12,176,144 B2
(45) Date of Patent: Dec. 24, 2024

(54) CONTROL CIRCUITS FOR SUPPLYING CURRENT TO ACTUATE SOLENOIDS

(71) Applicant: Emerson Electric Co., St. Louis, MO (US)

(72) Inventor: Jeffrey N. Arensmeier, Fenton, MO (US)

(73) Assignee: Copeland Comfort Control LP, St. Louis, MO (US)

( * ) Notice: Subject to any disclaimer, the term of this patent is extended or adjusted under 35 U.S.C. 154(b) by 343 days.

(21) Appl. No.: 17/954,661

(22) Filed: Sep. 28, 2022

(65) Prior Publication Data

US 2024/0105372 A1    Mar. 28, 2024

(51) Int. Cl.
| | | |
|---|---|---|
| *H01F 7/06* | (2006.01) | |
| *F16K 31/06* | (2006.01) | |
| *H03K 3/017* | (2006.01) | |

(52) U.S. Cl.
CPC ......... *H01F 7/064* (2013.01); *F16K 31/0675* (2013.01); *H03K 3/017* (2013.01)

(58) Field of Classification Search
CPC ..... H03K 3/017; H01F 7/1805; H01F 7/1844; H01F 7/064; H01F 2007/1888; F16K 31/0675
USPC ....................................................... 361/160
See application file for complete search history.

(56) References Cited

U.S. PATENT DOCUMENTS

| | | | | |
|---|---|---|---|---|
| 4,665,348 A | * | 5/1987 | Stupak, Jr. ............ | H01F 7/1844 318/135 |
| 6,249,418 B1 | * | 6/2001 | Bergstrom .......... | F16C 32/0451 361/152 |
| 10,605,478 B1 | | 3/2020 | Furmanek | |

FOREIGN PATENT DOCUMENTS

KR          513903 B1 *  9/2005  ............ F24F 1/0059

OTHER PUBLICATIONS

Machine translation of Arakawa et al. Korean Patent Document KR 10-0513903 B1 Sep. 2005 (Year: 2005).*
DRV110; Texas Instruments; www.ti.com; Mar. 2018; 29 pages.
TPS62933, TPS62932, TPS62933F, TPS62933P, TPS62933; Texas Instruments; www.ti.com; Jun. 2021; 51 pages.
SupplyHouse.com, Solenoids; 2022; 8 pages.
200RB 2T3; Emerson Alco Controls; Dec. 9, 2015 5 pages.

* cited by examiner

*Primary Examiner* — Kevin J Comber
(74) *Attorney, Agent, or Firm* — Harness, Dickey & Pierce, P.L.C.; Anthony G. Fussner

(57) ABSTRACT

Disclosed are exemplary embodiments of control circuits for supplying current to actuate solenoids, such as refrigerant valves in HVAC systems, other valves, "solenoid" style contactors, other coil driven actuators, etc. In exemplary embodiments, a control circuit for supplying current to actuate a solenoid comprises a solenoid coil and a switch coupled with the solenoid coil. The control circuit may be configured such that the solenoid coil is operable as a load coil and a switch mode supply coil and such that the switch is configured to operate a load and power supply of the control circuit. Additionally, or alternatively, the control circuit may include a current monitoring shunt and a flyback diode that are located in a circulating current loop defined by and/or including the solenoid coil, the current monitoring shunt, and the flyback diode.

23 Claims, 6 Drawing Sheets

CONTROL CIRCUITS FOR SUPPLYING CURRENT TO ACTUATE SOLENOIDS

FIELD

The present disclosure generally relates to control circuits for supplying current to actuate solenoids, such as refrigerant valves in HVAC systems, other valves, "solenoid" style contactors, other coil driven actuators, etc.

BACKGROUND

This section provides background information related to the present disclosure which is not necessarily prior art.

A voltage may be output to a solenoid coil to actuate a valve in an HVAC system. The solenoid coil may be actuated using an opening magnetic force and a holding magnetic force.

Solenoid force versus stroke curves indicate that the force generated by a magnetic solenoid actuator is lowest when the magnetic air gap is the largest. This is typically the case before the armature has moved, and the armature is farthest away from its home position. For refrigerant valves in HVAC systems, this position is typically set as the closed/de-energized position. Therefore, solenoid coils powered by a DC source may be sized to allow the actuator to begin moving when the actuator is in its weakest position and to hold the actuator when the actuator is in its strongest position. If two separate currents are applied to the solenoid coil by a control circuit, then a larger output current (the pick current) can be used for the picking or opening phase of the solenoid coil. And after a time delay elapses, a smaller output current (the hold current) can be used for the holding phase of the solenoid coil.

DRAWINGS

The drawings described herein are for illustrative purposes only of selected embodiments and not all possible implementations and are not intended to limit the scope of the present disclosure.

Corresponding reference numerals indicate corresponding (although not necessarily identical) parts throughout the several views of the drawings.

DETAILED DESCRIPTION

Figure 1:
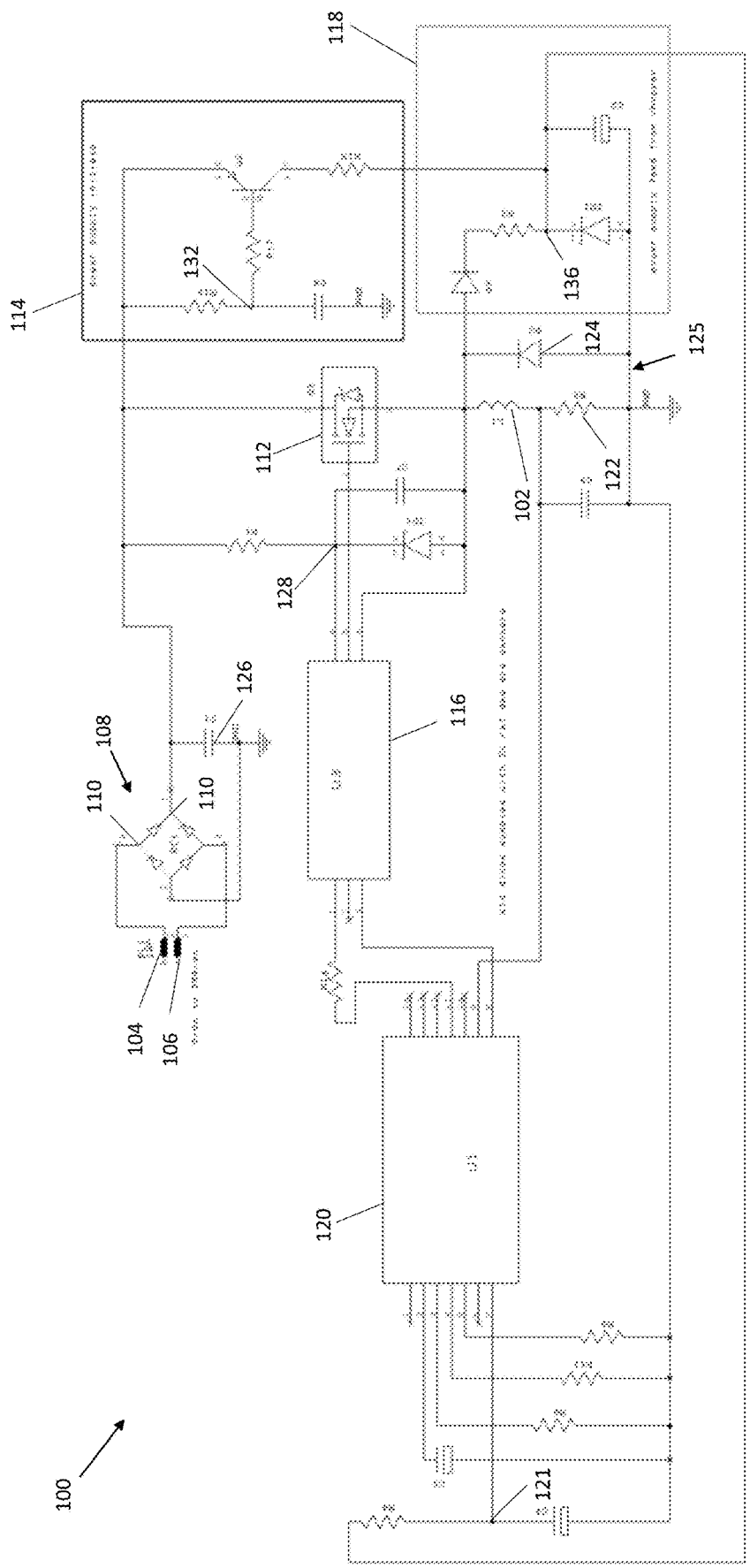
FIG. 1 is a wiring diagram of a control circuit for supplying current to actuate a valve (broadly, a solenoid) according to an example embodiment of the present disclosure.
Figure 2:
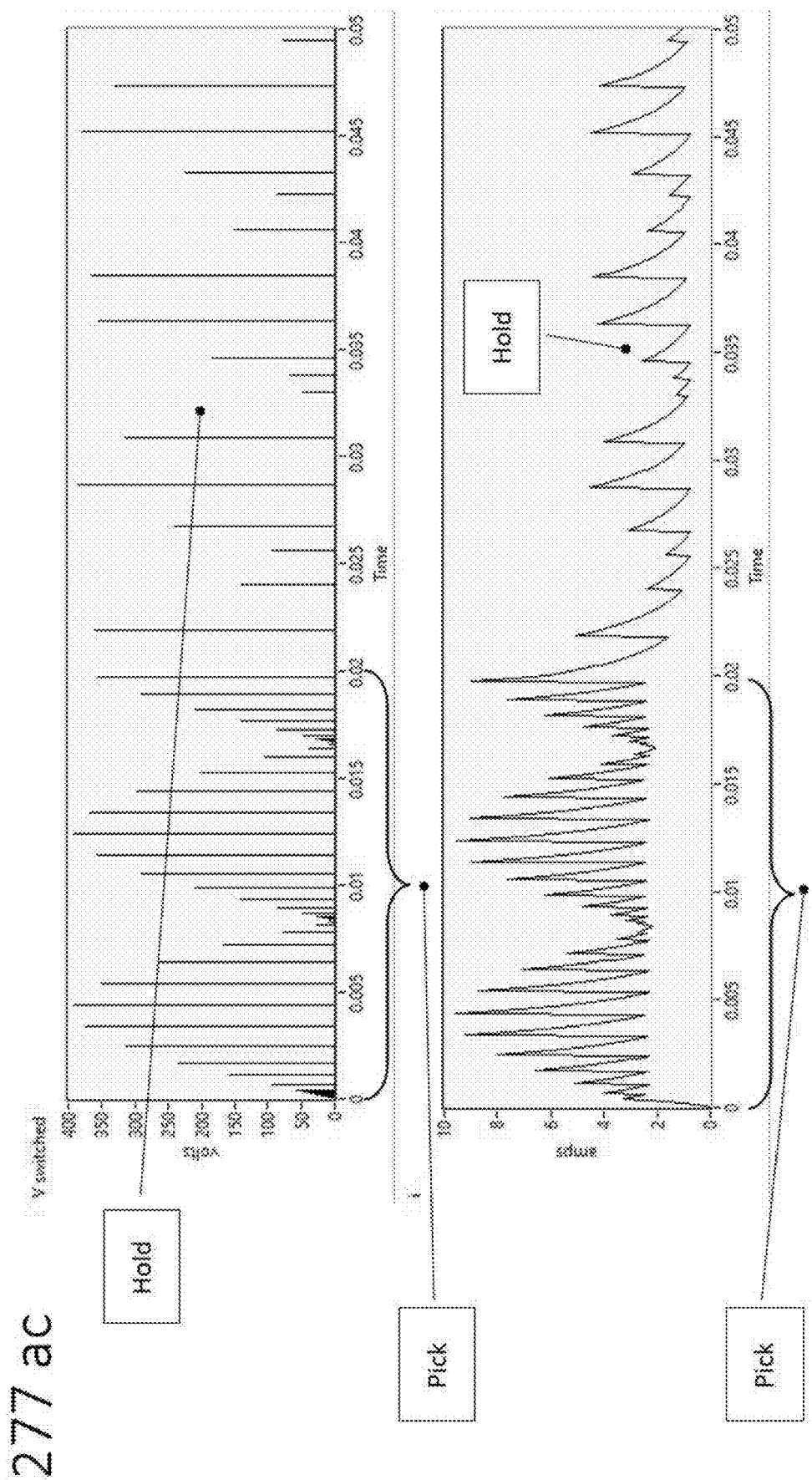
FIGS. 2-6 illustrate line graphs of example drive voltage switching (in volts) and output current (in amps) supplied to a valve (broadly, a solenoid) over time (in seconds) by the control circuit shown in FIG. 1 at 277 ac, 24 ac, 120 ac, 25 dc, and 15 dc, respectively.
Figure 3:
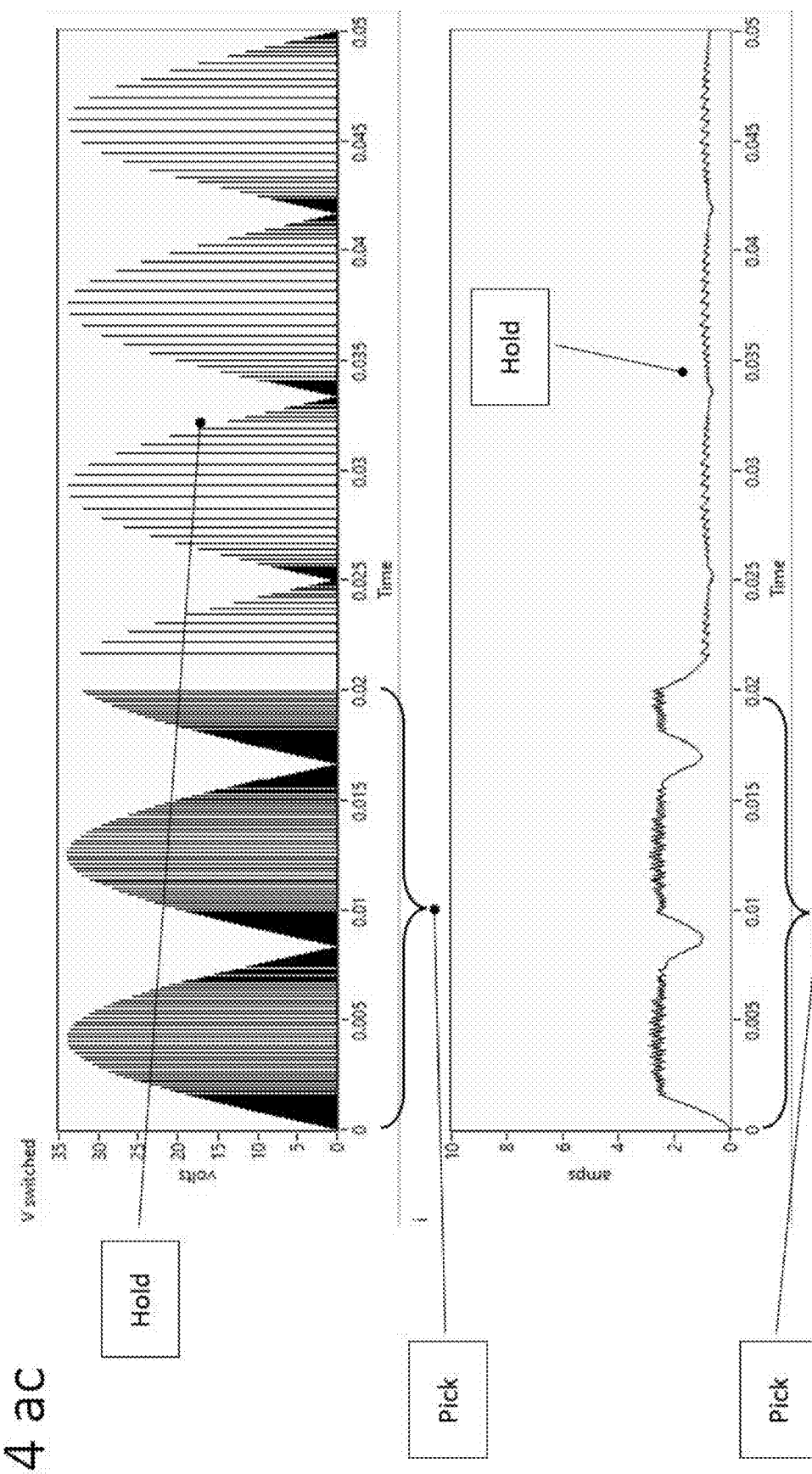
Figure 4:
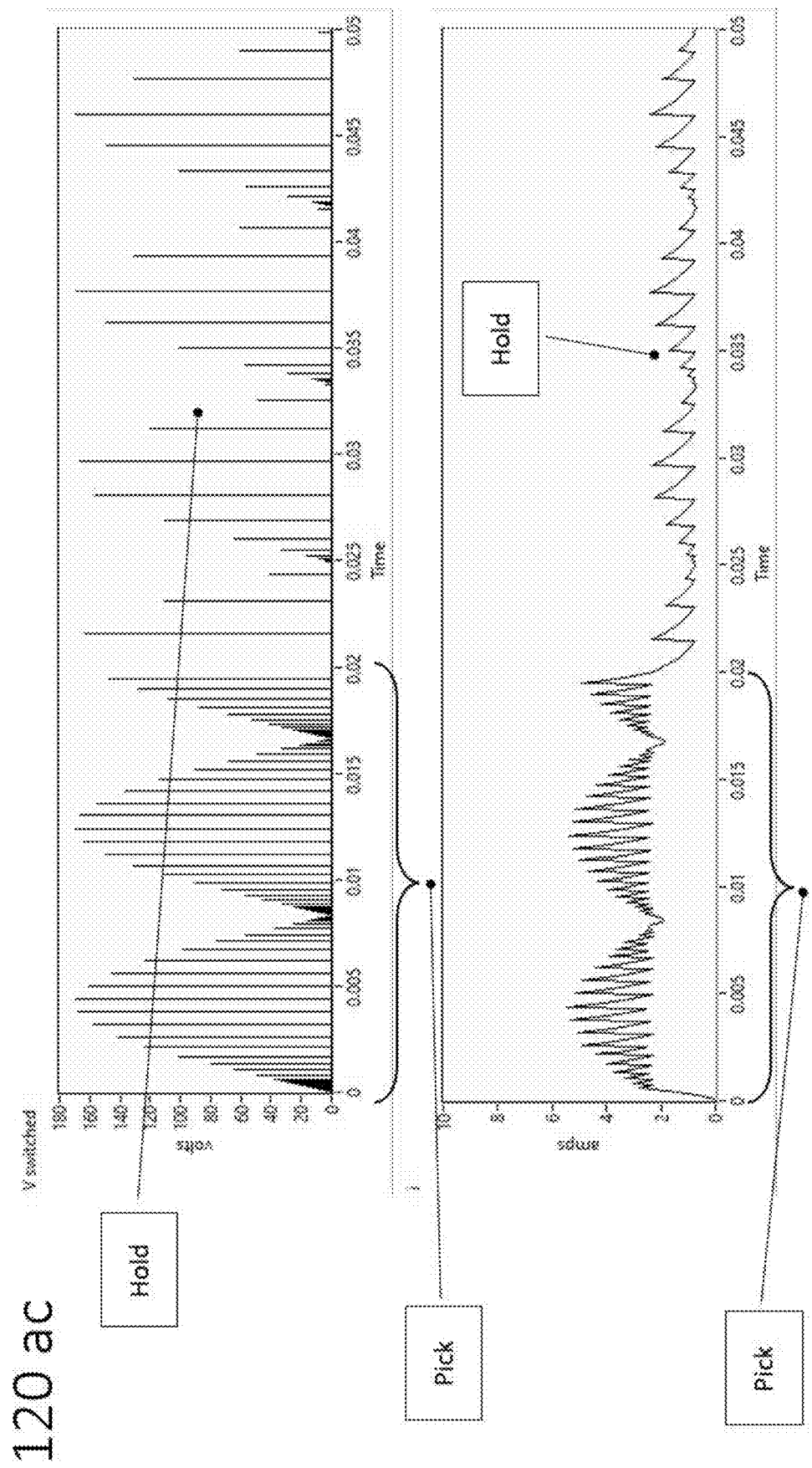
Figure 5:
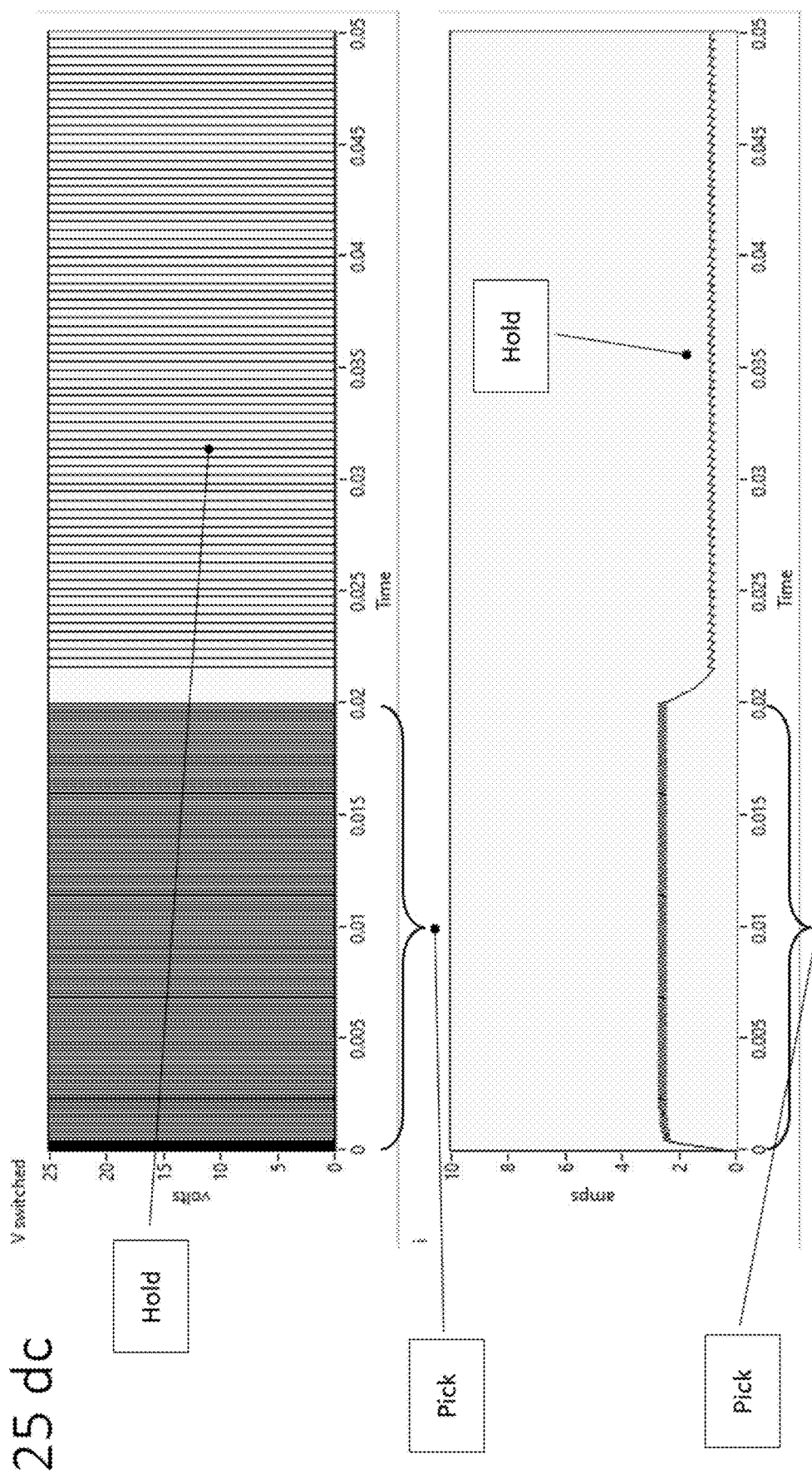
Figure 6:
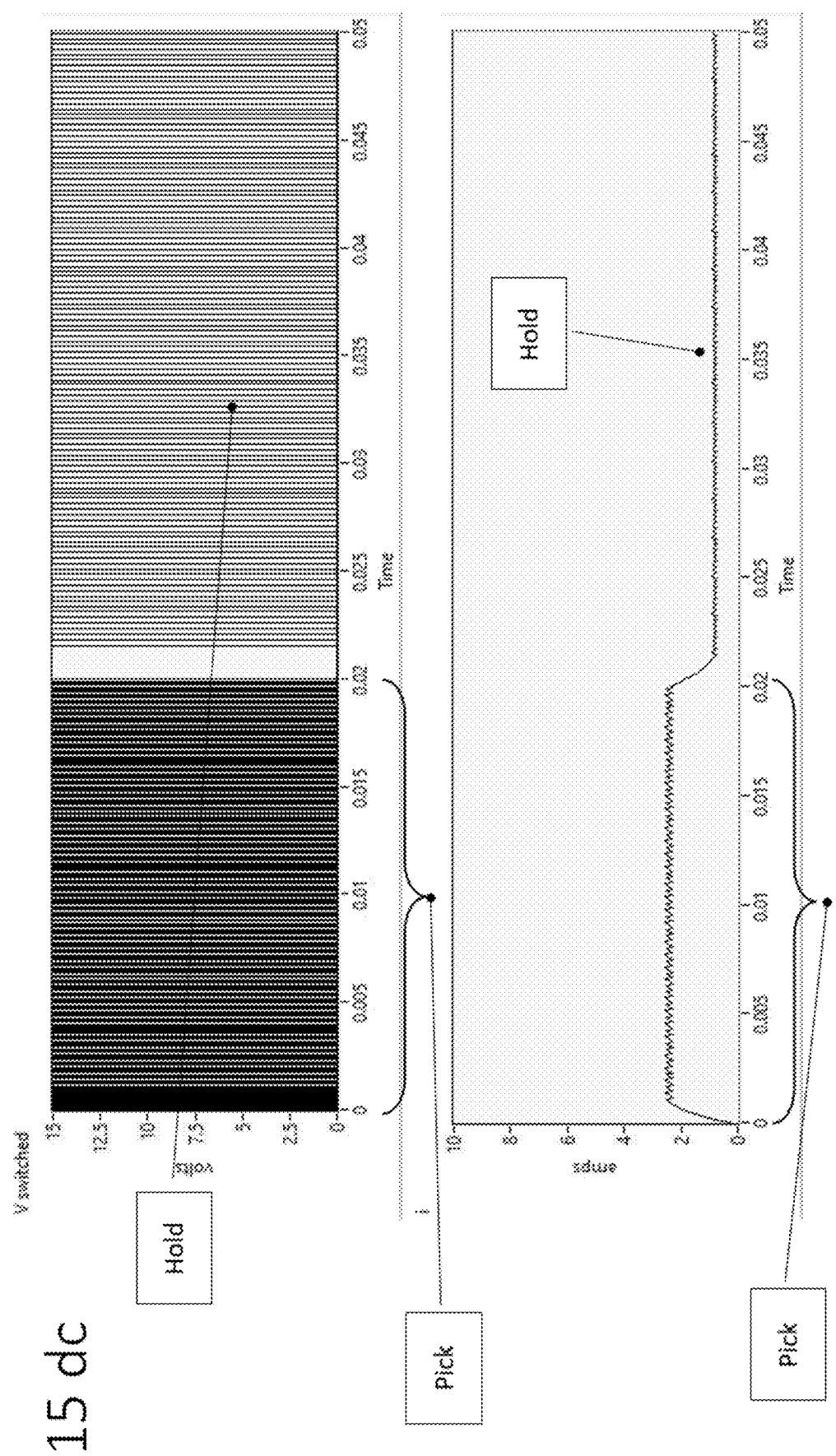

Example embodiments will now be described more fully with reference to the accompanying drawings.

As recognized herein, conventional solenoid coil designs may suffer from one or more of the following drawbacks. For example, a conventional solenoid coil design may simply be an uncontrolled coil. To obtain sufficient pull-in current, resistance/impedance is low. This, in turn, results in high steady state currents. For A/C coils, steady state power drops slightly as the air gap closes and inductive impedance increases. For DC coils, operation is continuous at the pull-in power. In both cases, however, this results in high steady state power consumption and high operating temperatures. Nominal power levels in refrigeration solenoids are about 15 watts resulting in significant heat rise, which requires a higher insulation class wire and phenolic encapsulation in many cases. Additionally, this requires numerous coils to cover various voltages and, in some cases, separate 50 Hz and 60 Hz coils. Power and heat limitations restrict solenoid performance, e.g., Maximum Operating Pressure Differential (MOPD), etc.

After recognizing the above, exemplary embodiments of control circuits were developed and/or are disclosed herein that are configured to provide electronic control for the solenoid coil. The control circuit provides a pick and hold operation during which two different current values may be applied to a direct current (DC) solenoid coil load to actuate a valve (broadly, a solenoid), e.g., in an HVAC system, etc. Initially, the current output by the control circuit (the pick current) has a higher value suitable for picking or opening the valve, and the output current is thereafter reduced to a lower value (the hold current) suitable for holding the valve open. Advantageously, reducing the higher pick current to the lower hold current reduces heat from power dissipation in the solenoid coil and also enables the use of a smaller solenoid coil.

For the pick operation, the pick current having a high power level is briefly applied (e.g., for about 30 milliseconds (ms), etc.) to actuate the solenoid. After pull-in, the hold operation includes applying only enough power to consistently hold the valve open, wherein the hold power may be less than ¼ the pull-in power, etc. With the example embodiment control circuits disclosed herein, the controlled value is current instead of voltage or frequency. An exemplary embodiment may be configured to operate from 12 volts to 305 volts with one circuit and coil.

The control circuit is configured such that the pick and hold currents are actively and electronically controlled, which enables operation over a wide voltage range (e.g., a voltage range in which the ratio of the highest voltage to the lowest voltage is greater than 10:1, 25:1, etc.). For example, AC or DC inputs of various voltages and frequencies may be used as the inputs to the control circuits disclosed herein. By comparison, a conventional control circuit may be configured for use with a single voltage per SKU, with a very limited voltage range for each SKU version, and/or with 12 volt DC and 24 volt DC. With a conventional control circuit, the pick current is not electronically controlled as the pick current is only timed and controlled by the coil resistance. A conventional control circuit may also have a relatively low pick to hold current ratio and have significantly more steady state power than exemplary embodiments of the control circuits disclosed herein.

In exemplary embodiments disclosed herein, the control circuit is configured with an inductor that functions or operates as the load and the switch mode inductor. In such exemplary embodiment, the inductor comprises the load coil and also the switch mode supply coil. Also, the control circuit includes a switching element (e.g., field-effect transistor (FET), etc.) configured to be operable such that the same switching element operates the load and the power supply. In exemplary embodiments, the control circuit is configured to monitor coil current via a current monitoring shunt located in a circulating current loop.

Example embodiments described herein may provide one or more (but not necessarily any or all) of the following advantages: ability to apply higher pick power levels, increased pick power with improved MOPD (e.g., from 300 PSI to 570 PSI, etc.), greatly reduced steady state power (e.g., about 1/20 of traditional coils, etc.), lower operating temperature, enables use of a lower insulation class wire at a reduced cost, less magnet wire required in solenoid construction (e.g., 1/4 to 1/3 that of a traditional coil, etc.), reduced material cost and wind time, enables use of larger wire with a reduced breakage risk when winding the coil, enables use of lower cost and more environmentally friendly thermoplastic encapsulation, usable for field replacement of existing coils, stronger picking or opening of a valve, less heat rise during the holding phase of a valve, reduced energy consumption during operation, smaller coils and valve sizes, etc.

In exemplary embodiment, the control circuit is configured to be operable for providing a controlled pick current and for monitoring and controlling full coil current including circulating current. The control circuit is also configured to treat the coil as the load and inductive element. The control circuit includes a sense resistor in the circulating current loop. The control circuit is configured to be operable with full drive at boot-up, rapid recycle (e.g., less than 0.5 seconds, etc.), and a wide voltage range (e.g., a voltage range in which the ratio of the highest voltage to the lowest voltage is greater than 10:1, 25:1, etc.).

FIG. 1 illustrates an exemplary embodiment of a control circuit 100 for supplying actuate a valve (broadly, a solenoid) in an HVAC system. As shown in FIG. 1, the control circuit 100 includes a solenoid coil 102 (e.g., an actuator, etc.) adapted to selectively open and close the valve in the HVAC system. The control circuit 100 is configured such that the solenoid coil 102 is the load coil and the switch mode supply coil.

The control circuit 100 includes input terminals 104 and 106 coupled to receive a power input (e.g., an alternating current (AC) power input, a direct current (DC) power input, a power input from 9 vdc to 304 vac, etc.). The control circuit 100 further includes a rectifier bridge 108 (broadly, a rectifier) coupled between the input terminals 104, 106 and the solenoid coil 102 to supply current to the solenoid coil 102. The rectifier bridge 108 includes four nodes 110 and at least four diodes each connected between a corresponding pair of the four nodes 110.

The control circuit 100 includes a switch 112 coupled with the coil 102, the rectifier bridge 108, a boot-up circuit 114, an optocoupler 116 (broadly, an isolated driver or coupler), and a power supply feed 118 (e.g., a power supply feed from a chopper, etc.). The control circuit 100 is a switch mode current supply (e.g., a pulse width modulation (PWM), a pulse position modulation (PPM) duty cycle, a combination of PWM and PPM, etc.). For example, the control circuit 100 may be configured to be operable at 20 kilohertz (kHz) to 70 kHz depending on the particular driver 120 that is included in the control circuit 100. And the switch mode current power supply for the system is operated by the same switching element 112 as the coil 102. This reduces total component count and provides immediate start-up.

The control circuit 100 is preferably configured to start with the driver 120 (e.g., pulse width modulation (PWM) and/or pulse position modulation (PPM) current controller for solenoids, etc.) ON to thereby allow current to flow through the coil 102 The control circuit 100 may be configured to start with a stout initial pulse but boots faster as input voltage increases.

The driver 120 is configured to control current levels and timing control. The driver 120 is also configured to include the switching control. Accordingly, the switch 112 may be considered a servo that is instructed by the driver 120, which, in turn, may be a PWM and/or PPM controller as disclosed herein. The driver 120 may be configured to adjust the reference voltage over time, thereby providing the pick function.

The driver 120 is coupled in series with capacitor C3 and resistors R6, R11, and R8. The driver 120 is also coupled in series with the optocoupler 116 and resistor R18 that is coupled in series between the driver 120 and the optocoupler 116. The driver 120 is further coupled with a node 121 defined between resistor R4, capacitor C4, and the driver 120. The resistor R4 is coupled in series with the power supply feed 118. The capacitor C4 is coupled in series with capacitor C9 and in parallel with capacitor C3 and resistors R6, R11, and R8.

The optocoupler 116 (broadly, an isolated driver or coupler) is coupled in series with the switch 112 and with the power supply feed 118. The optocoupler 116 is further coupled to a node 128 defined between the resistor R1, capacitor C7, Zener diode ZD1, and the optocoupler 116. The optocoupler 116 is also coupled with the circulating current loop 125, which is defined by and includes the coil 102, shunt resistor (R3) 122, and flyback diode 124. The optocoupler or isolated coupler 116 is configured to be operable for providing isolation between high voltage components and lower voltage components of the control circuit 100.

The optocoupler 116 is configured to disable the driver 120 when a comparator (e.g., comparator of the driver 120, etc.) determines, via the sensed current, that the voltage on the current sense resistor or current monitoring shunt 122 is above the setpoint (Vref). The positive feedback on the comparator provides some hysteresis to reduce the switching noise. The driver 120 may also function to step Vref down after a moment thereby providing the pick. By way of example, the optocoupler 116 may comprise a single-channel opto-compatible isolated gate driver, which may provide improved reliability and inherent FET gate protection.

In this exemplary embodiment, the driver or controller 120 is configured to be operable as or perform the function of the comparator, perform PWM and/or PPM control, and interface with the coil 102. The driver or controller 120 may be operable as a current regulator that compares the voltage from R3 with a setpoint voltage from the resistors R6, R11, R8 coupled with the driver or controller 120. Advantageously, the combination of the driver and comparator may allow for a smaller overall size and reduced parts count In an alternative embodiment, the control circuit 100 may include a comparator with hysteresis controls, which helps control the switching profile and reduces the variations over voltage and provides some control over RF emissions. In such embodiment, the control circuit may include a resistor ladder that sets the switch points. A feedback circuit may be used to provide additional negative feedback as voltage and therefore current slew rate increase.

The current monitoring shunt or current sense resistor (R3) 122 is within the circulating current loop 125 and operable for monitoring total current through the coil 102. The control circuit 100 further includes a flyback diode 124 that provides the circulating current path 125. The current monitoring shunt 122 is coupled in series with a ground potential and with the coil 102. The coil 102 and current monitoring shunt 122 are coupled in parallel with the flyback diode 124 to thereby define the circulating current path 125. The current monitoring shunt 122 is also coupled in parallel with the capacitor C9.

A smoothing capacitor 126 is coupled with two nodes 110 of the rectifier bridge 108. The smoothing capacitor 126 is also coupled in series with a ground potential, resistor R1, switch 112, and power supply feed 118.

The power supply initiate or boot-up circuit 114 includes resistors R15, R16, capacitor C8, and switch Q2. The capacitor C8 is coupled in series with a ground potential. The resistor R15 is coupled in series between the switch Q2 and the power supply feed 118. A node 132 is defined between the capacitor C8, resistor R16, and resistor R17. The switch Q2 is also coupled with the resistors R1, R16, R17, switch 112, smoothing capacitor 126, and rectifier bridge 108. The power supply initiate or boot-up circuit 114 may be operable as a high voltage transistor that provides a charge into C2 for a determined time (e.g., a few milliseconds (ms), etc.) and then turns off.

The power supply feed 118 includes a capacitor C2, Zener diode ZD2, resistor R2, and diode D3. The resistor R2 is coupled in series with the Zener diode ZD2 and the diode D3. The capacitor C2 and Zener diode ZD2 are coupled in parallel. A node 136 is defined between the capacitor C2, Zener diode ZD2, and resistors R2 and R15. Overall, the power supply feed 118 is coupled with the switch 112, the power supply initiate or boot-up circuit 114, the optocoupler 116, and with the driver 120 via the resistor R4 and node 121.

The control circuit 100 is configured to be operable for adjusting the time between pulses and/or the duration. For example, at a nominal 20 kHz, there would be 400 pulses during the 20 millisecond pick, the duration of which is adjusted.

The switch 112 may be a metal-oxide semiconductor field-effect transistor (MOSFET), such as a N-channel MOSFET, P-channel MOSFET, etc. In other embodiments other suitable switching elements (e.g., bipolar-junction transistors (BJTs), insulated-gated bipolar transistor (IGBT), etc.) may be used.

The control circuit 100 is configured such that the pick and hold currents are actively and electronically controlled, which enables operation over a wide voltage range (e.g., a voltage range in which the ratio of the highest voltage to the lowest voltage is greater than 10:1, 25:1, etc.). For example, AC or DC inputs of various voltages and frequencies may be used as the inputs to the control circuit 100. By comparison, a conventional control circuit may instead include a timing RC circuit that has a fixed time constant corresponding to values of the resistors and capacitor. And the fixed time constant of the conventional RC circuit may correspond to the specified time delay for turning a switch OFF to thereby switch from an initial higher picking current to a lower holding current and without compensating for various supply voltages.

Also in this exemplary embodiment, the control circuit 100 is configured such that the inductor 102 functions or operates as the load and the switch mode inductor. Stated differently, the inductor 102 comprises the load coil and also the switch mode supply coil. The control circuit 100 includes the switching element 112 (e.g., a MOSFET, other field-effect transistor (FET), insulated-gated bipolar transistor (IGBT), etc.) configured to be operable such that the same switching element 112 operates the load and the power supply.

The control circuit 100 is also configured to monitor coil current via the current monitoring shunt 122 located in the circulating current loop 125 defined by the coil 102, shunt resistor (R3) 122, and diode (D2) 124. The control circuit 100 is thus configured to be operable for providing a controlled pick current and for monitoring full coil current including the circulating current.

A valve assembly may include a valve with the control circuit 100 located in the valve. The circuit may alternatively be housed in an in-cable module or module encapsulated in a wiring harness, etc. In other embodiments, a furnace control assembly may include an integrated furnace control (IFC), with the control circuit 100 located in the furnace control.

FIGS. 2-6 illustrate line graphs of example drive voltage switching (in volts) and output current (in amps) supplied to a valve (broadly, a solenoid) over time (in seconds) by the control circuit 100 shown in FIG. 1 at 277 ac, 24 ac, 120 ac, 25 dc, and 15 dc, respectively. FIGS. 2-6 depict a mixed PWM-PPM switching scheme. The drive voltage switching is denser during the opening or picking phase than during the holding phase. The output current has a higher average value during the opening or picking phase than during the holding phase. The example voltage and current values and timings in FIGS. 2-6 are provided for purposes of illustration only, and other embodiments may have higher or lower voltages and currents, longer or shorter holding and opening or picking phases, etc.

Disclosed are exemplary embodiments of control circuits for supplying current to actuate solenoids, such as refrigerant valves in HVAC systems, other valves, "solenoid" style contactors, other coil driven actuators, etc. In exemplary embodiments, a control circuit for supplying current to actuate a solenoid comprises a solenoid coil and a switch coupled with the solenoid coil. The control circuit may be configured such that the solenoid coil is operable as a load coil and a switch mode supply coil and such that the switch is configured to operate a load and power supply of the control circuit. Additionally, or alternatively, the control circuit may include a current monitoring shunt and a flyback diode that are located in a circulating current loop defined by and/or including the solenoid coil, the current monitoring shunt, and the flyback diode.

In exemplary embodiments, the control circuit is configured to be operable for monitoring full current through the solenoid coil including a circulating current via the current monitoring shunt located in the circulating current loop. The current monitoring shunt may comprise a current sense resistor coupled in series with the solenoid coil and the flyback diode in the circulating current loop.

In exemplary embodiments, the control circuit comprises a switched mode current supply including a pulse width modulation (PWM) and/or pulse position modulation (PPM) duty cycle. The control circuit is configured to be operable to: increase the PWM and/or PPM duty cycle, via controlling the switch to have longer duration pulses, to thereby increase the current supplied to the solenoid coil in response to determining that the current supplied to the solenoid coil is too low; and decrease the PWM and/or PPM duty cycle, via controlling the switch to have shorter duration pulses, to thereby decrease the current supplied to the solenoid coil in response to determining that the current supplied to the solenoid coil is too high.

In exemplary embodiments, the control circuit comprises a switched mode current supply including a pulse width modulation (PWM) and/or pulse position modulation (PPM) duty cycle. The control circuit is configured to be operable for adjusting the PWM and/or PPM duty cycle, via controllably adjusting a pulse duration of the switch, when switching between a first current supplied to the solenoid coil and a second current, lower than the first current, supplied to the solenoid coil.

In exemplary embodiments, the solenoid coil is adapted to selectively open and close a valve. The control circuit is configured to be operable for adjusting a pulse width modulation (PWM) and/or pulse position modulation (PPM) duty cycle, via controllably adjusting a pulse duration of the switch, when switching between a first current supplied to the solenoid coil for opening the valve and a second current, lower than the first current, supplied to the solenoid coil for holding the valve open.

In exemplary embodiments, the control circuit includes a pulse width modulation (PWM) and/or pulse position modulation (PPM) current solenoid controller coupled with the switch and the solenoid coil. The PWM and/or PPM current solenoid controller is configured to be operable for adjusting the PWM and/or PPM duty cycle, via controllably adjusting a pulse duration of the switch, when switching between a first current supplied to the solenoid coil and a second current, lower than the first current, supplied to the solenoid coil.

In exemplary embodiments, the control circuit includes a pulse width modulation (PWM) and/or pulse position modulation (PPM) current solenoid controller coupled with the switch and the solenoid coil such that the switch drives both the solenoid coil and a controller power supply.

In exemplary embodiments, the control circuit is configured to treat the solenoid coil as the load and inductive element.

In exemplary embodiments, the switch is coupled with a boot-up circuit and an isolated coupler configured to be operable for providing isolation between high voltage components and lower voltage components of the control circuit.

In exemplary embodiments, the control circuit includes a driver configured to control current levels, timing, and switching. The driver is configured to adjust reference voltage over time to thereby provide a pick function for the solenoid. The driver is coupled with an optocoupler configured to disable the driver when a comparator determines, via sensed current, that voltage on the current monitoring shunt in the circulating current loop is above a reference voltage.

In exemplary embodiments, the control circuit includes a driver and an isolated coupler coupled in series between the driver and the switch. The isolated coupler is configured to be operable for providing isolation between the driver and lower voltage components of the control circuit.

In exemplary embodiments, the control circuit includes a driver coupled with the switch and the solenoid coil. The driver is configured to be operable as or perform the function of a comparator, perform pulse width modulation (PWM) and/or pulse position modulation (PPM) control, and interface with the solenoid coil.

In exemplary embodiments, the control circuit includes a rectifier coupled with the switch. The switch is configured to be coupled with the power supply via the rectifier for supplying to the solenoid coil via the switch.

In exemplary embodiments, the control circuit includes a current monitoring shunt coupled with the solenoid coil. A flyback diode is coupled with the solenoid coil and the current monitoring shunt such that a circulating current loop is defined by and/or includes the solenoid coil, the current monitoring shunt, and the flyback diode. The control circuit is configured to be operable for monitoring full current through the solenoid coil including a circulating current via the current monitoring shunt located in the circulating current loop. The current monitoring shunt may comprise a current sense resistor coupled in series with the solenoid coil and the flyback diode in the circulating current loop.

In exemplary embodiments, a valve assembly comprises a valve and a control circuit disclosed herein. The solenoid coil is adapted to selectively open and close the valve. The control circuit is configured to be operable for adjusting a pulse width modulation (PWM) and/or pulse position modulation (PPM) duty cycle when switching between a first current supplied to the solenoid coil for opening the valve and a second current, lower than the first current, supplied to the solenoid coil for holding the valve open.

The example embodiments disclosed herein may be used in any suitable application that includes solenoids, such as valve(s) with solenoid actuator(s) (e.g., refrigerant valves in HVAC systems, water valves, gas valves, other valves, etc.), "solenoid" style contactors (e.g., high current DC contactors, etc.), other coil driven actuators, etc. For example, the control circuits may be particularly useful for refrigerant valves with DC solenoid actuators that require a greater magnetic force to open or pick than the force required to stay open or hold. Exemplary circuits disclosed herein may also be used with normally closed (NC) valves whereby the exemplary circuits disclosed herein may greatly improve MOPD (Maximum Operating Pressure Differential) performance for such NC valves. Exemplary circuits disclosed herein may also be used with other coil driven devices where it would be desirable to have a wide voltage range (e.g., a voltage range in which the ratio of the highest voltage to the lowest voltage is greater than 10:1, 25:1, etc.). Exemplary embodiments may also be used in residential refrigeration applications for isolating parts of systems using A2L refrigerants.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally," "about," and "substantially," may be used herein to mean within manufacturing tolerances. Whether or not modified by the term "about," the claims include equivalents to the quantities.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A control circuit for supplying current to actuate a solenoid, the control circuit comprising a solenoid coil and a switch coupled with the solenoid coil, wherein:
    the control circuit is configured such that the solenoid coil is operable as a load coil and a switch mode supply coil and such that the switch is configured to operate a load and power supply of the control circuit; and
    the control circuit includes a current monitoring shunt and a flyback diode that are located in a circulating current loop defined by and/or including the solenoid coil, the current monitoring shunt, and the flyback diode.

2. The control circuit of claim 1, wherein the control circuit is configured to be operable for monitoring full current through the solenoid coil including a circulating current via the current monitoring shunt located in the circulating current loop.

3. The control circuit of claim 1, wherein the current monitoring shunt comprises a current sense resistor coupled in series with the solenoid coil and the flyback diode in the circulating current loop.

4. The control circuit of claim 1, wherein:
    the control circuit comprises a switched mode current supply including a pulse width modulation (PWM) and/or pulse position modulation (PPM) duty cycle; and
    the control circuit is configured to be operable to:
        increase the PWM and/or PPM duty cycle, via controlling the switch to have longer duration pulses, to thereby increase the current supplied to the solenoid coil in response to determining that the current supplied to the solenoid coil is too low; and
        decrease the PWM and/or PPM duty cycle, via controlling the switch to have shorter duration pulses, to thereby decrease the current supplied to the solenoid coil in response to determining that the current supplied to the solenoid coil is too high.

5. The control circuit of claim 1, wherein:
    the control circuit comprises a switched mode current supply including a pulse width modulation (PWM) and/or pulse position modulation (PPM) duty cycle; and
    the control circuit is configured to be operable for adjusting the PWM and/or PPM duty cycle, via controllably adjusting a pulse duration of the switch, when switching between a first current supplied to the solenoid coil and a second current, lower than the first current, supplied to the solenoid coil.

6. The control circuit of claim 1, wherein:
the solenoid coil is adapted to selectively open and close a valve; and
the control circuit is configured to be operable for adjusting a pulse width modulation (PWM) and/or pulse position modulation (PPM) duty cycle, via controllably adjusting a pulse duration of the switch, when switching between a first current supplied to the solenoid coil for opening the valve and a second current, lower than the first current, supplied to the solenoid coil for holding the valve open.

7. The control circuit of claim 1, wherein the control circuit includes a pulse width modulation (PWM) and/or pulse position modulation (PPM) current solenoid controller coupled with the switch and the solenoid coil, whereby the PWM and/or PPM current solenoid controller is configured to be operable for adjusting the PWM and/or PPM duty cycle, via controllably adjusting a pulse duration of the switch, when switching between a first current supplied to the solenoid coil and a second current, lower than the first current, supplied to the solenoid coil.

8. The control circuit of claim 1, wherein the control circuit includes a pulse width modulation (PWM) and/or pulse position modulation (PPM) current solenoid controller coupled with the switch and the solenoid coil such that the switch drives both the solenoid coil and a controller power supply.

9. The control circuit of claim 1, wherein the control circuit is configured to treat the solenoid coil as the load and inductive element.

10. The control circuit of claim 1, wherein the switch is coupled with a boot-up circuit and an isolated coupler configured to be operable for providing isolation between high voltage components and lower voltage components of the control circuit.

11. The control circuit of claim 1, wherein:
the control circuit includes a driver configured to control current levels, timing, and switching;
the driver is configured to adjust reference voltage over time to thereby provide a pick function for the solenoid; and
the driver is coupled with an optocoupler configured to disable the driver when a comparator determines, via sensed current, that voltage on the current monitoring shunt in the circulating current loop is above a reference voltage.

12. The control circuit of claim 1, wherein the control circuit includes a driver and an isolated coupler coupled in series between the driver and the switch, the isolated coupler configured to be operable for providing isolation between the driver and lower voltage components of the control circuit.

13. The control circuit of claim 1, wherein the control circuit includes a driver coupled with the switch and the solenoid coil, the driver is configured to be operable as or perform the function of a comparator, perform pulse width modulation (PWM) and/or pulse position modulation (PPM) control, and interface with the solenoid coil.

14. The control circuit of claim 1, wherein:
the control circuit includes a rectifier coupled with the switch; and
the switch is configured to be coupled with the power supply via the rectifier for supplying to the solenoid coil via the switch.

15. A valve assembly comprising a valve and the control circuit of claim 1, wherein the solenoid coil is adapted to selectively open and close the valve, and wherein the control circuit is configured to be operable for adjusting a pulse width modulation (PWM) and/or pulse position modulation (PPM) duty cycle when switching between a first current supplied to the solenoid coil for opening the valve and a second current, lower than the first current, supplied to the solenoid coil for holding the valve open.

16. A control circuit for supplying current to actuate a solenoid, the control circuit comprising a solenoid coil and a switch coupled with the solenoid coil, wherein the control circuit is configured such that the solenoid coil is operable as a load coil and a switch mode supply coil and such that the switch is configured to operate a load and power supply of the control circuit.

17. The control circuit of claim 16, wherein:
the control circuit comprises a switched mode current supply including a pulse width modulation (PWM) and/or pulse position modulation (PPM) duty cycle; and
the control circuit is configured to be operable to:
increase the PWM and/or PPM duty cycle, via controlling the switch to have longer duration pulses, to thereby increase the current supplied to the solenoid coil in response to determining that the current supplied to the solenoid coil is too low; and
decrease the PWM and/or PPM duty cycle, via controlling the switch to have shorter duration pulses, to thereby decrease the current supplied to the solenoid coil in response to determining that the current supplied to the solenoid coil is too high.

18. The control circuit of claim 16, wherein:
the control circuit comprises a switched mode current supply including a pulse width modulation (PWM) and/or pulse position modulation (PPM) duty cycle; and
the control circuit is configured to be operable for adjusting the PWM and/or PPM duty cycle, via controllably adjusting a pulse duration of the switch, when switching between a first current supplied to the solenoid coil and a second current, lower than the first current, supplied to the solenoid coil.

19. The control circuit of claim 16, wherein:
the solenoid coil is adapted to selectively open and close a valve; and
the control circuit is configured to be operable for adjusting a pulse width modulation (PWM) and/or pulse position modulation (PPM) duty cycle, via controllably adjusting a pulse duration of the switch, when switching between a first current supplied to the solenoid coil for opening the valve and a second current, lower than the first current, supplied to the solenoid coil for holding the valve open.

20. The control circuit of claim 16, wherein the control circuit includes a pulse width modulation (PWM) and/or pulse position modulation (PPM) current solenoid controller coupled with the switch and the solenoid coil, whereby the PWM and/or PPM current solenoid controller is configured to be operable for adjusting the PWM and/or PPM duty cycle, via controllably adjusting a pulse duration of the switch, when switching between a first current supplied to the solenoid coil and a second current, lower than the first current, supplied to the solenoid coil.

21. The control circuit of claim 16, wherein the control circuit includes a pulse width modulation (PWM) and/or pulse position modulation (PPM) current solenoid controller coupled with the switch and the solenoid coil such that the switch drives both the solenoid coil and a controller power supply.

22. The control circuit of claim 16, wherein the control circuit is configured to treat the solenoid coil as the load and inductive element.

23. A valve assembly comprising a valve and the control circuit of claim 16, wherein the solenoid coil is adapted to selectively open and close the valve, and wherein the control circuit is configured to be operable for adjusting a pulse width modulation (PWM) and/or pulse position modulation (PPM) duty cycle when switching between a first current supplied to the solenoid coil for opening the valve and a second current, lower than the first current, supplied to the solenoid coil for holding the valve open.

* * * * *